(12) United States Patent
Boehme et al.

(10) Patent No.: US 6,841,306 B2
(45) Date of Patent: Jan. 11, 2005

(54) POLYMERIC MOLD FOR PROVIDING A MICRO-SCALE PART

(75) Inventors: Dale R. Boehme, Pleasanton, CA (US); Michelle A. Bankert, San Francisco, CA (US); Todd R. Christenson, Albuquerque, NM (US)

(73) Assignee: Sandia National Laboratories, Livermore, CA (US)

( * ) Notice: Subject to any disclaimer, the term of this patent is extended or adjusted under 35 U.S.C. 154(b) by 332 days.

(21) Appl. No.: 10/217,690

(22) Filed: Aug. 12, 2002

(65) Prior Publication Data

US 2002/0189756 A1 Dec. 19, 2002

Related U.S. Application Data

(62) Division of application No. 09/493,926, filed on Jan. 28, 2000, now Pat. No. 6,517,665.
(60) Provisional application No. 60/177,929, filed on Jan. 25, 2000.

(51) Int. Cl.[7] .................................................. G03F 7/00
(52) U.S. Cl. ............................ 430/3; 430/320; 430/325; 430/326
(58) Field of Search ............................ 430/3, 320, 325, 430/326, 967

(56) References Cited

U.S. PATENT DOCUMENTS

| 4,393,129 A | * | 7/1983 | Glashauser et al. | 430/296 |
| 5,876,875 A | * | 3/1999 | Chiu | 430/3 |
| 6,372,389 B1 | * | 4/2002 | Watanabe | 430/3 |

* cited by examiner

*Primary Examiner*—John A. McPherson
(74) *Attorney, Agent, or Firm*—Timothy P. Evans

(57) ABSTRACT

The invention is a developer system for developing a PMMA photoresist having exposed patterns comprising features having both very small sizes, and very high aspect ratios. The developer system of the present invention comprises a developer tank, an intermediate rinse tank and a final rinse tank, each tank having a source of high frequency sonic agitation, temperature control, and continuous filtration. It has been found that by moving a patterned wafer, through a specific sequence of developer/rinse solutions, where an intermediate rinse solution completes development of those portions of the exposed resist left undeveloped after the development solution, by agitating the solutions with a source of high frequency sonic vibration, and by adjusting and closely controlling the temperatures and continuously filtering and recirculating these solutions, it is possible to maintain the kinetic dissolution of the exposed PMMA polymer as the rate limiting step.

5 Claims, 6 Drawing Sheets

POLYMERIC MOLD FOR PROVIDING A MICRO-SCALE PART

CROSS REFERENCE TO RELATED APPLICATIONS

This application is a division of prior U.S. patent application Ser. No. 09/493,926 originally filed Jan. 28, 2000 now U.S. Pat. No. 6,517,665 and entitled "LIGA DEVELOPER APPARATUS SYSTEM which claims benefit from U.S. Provisional 60/177,929 filed on Jan. 25, 2000.

The United States Government has rights in this invention pursuant to Contract No. DE-AC04-94AL85000 between the United States Department of Energy and the Sandia Corporation for the operation of the Sandia National Laboratories.

BACKGROUND OF THE INVENTION

The present invention relates to the production of microstructures and/or microparts, and particularly to a system for developing a polymeric mold used for the production of microparts. More particularly, the present invention relates to an apparatus for producing precise, high aspect ratio polymer molds which may be adapted for fabricating micro-scale, metal, polymer, or ceramic parts using the so-called LIGA process.

LIGA, is an acronym derived from the German words for Lithography, Electroforming, and Molding. The LIGA process is being evaluated worldwide as a method to produce microstructures and/or microparts from engineering materials.

The LIGA process was pioneered in the early 1980s as a method to produce precise, high aspect ratio microstructures from engineering materials, such as various metals, polymers, and ceramics. See E. W. Becker, et al., Microelectronic Engr. 4 (1986) 35; and W. Ehrfeld, et al., KFK-Nachrichten 10(4) (1987) 167.

In the general LIGA process x-ray radiation from a synchrotron source passes through, and is patterned by, a specially designed mask to produce deep exposures in a x-ray resist, typically polymethylmethacrylate (PMMA), with precise lateral dimensions. The PMMA, after exposure, is placed in a chemical developer to remove the exposed material and produce thereby a polymeric mold. This mold is most commonly used as an electroplating template to produce metal microparts or a metal master mold. If a metal master mold is made, it can be used to produce cost-effective replicates in other materials, primarily polymers. Finally, the process can be used also to directly produce PMMA microstructures and/or microparts.

One of the appeals of LIGA as a fabrication methodology is the ability to produce precise, micro-scale parts with high aspect ratios made from traditional metallic materials. Applications such as motors, spinnerets, and switches have been explored using metal microparts fabrication from LIGA. Over the past few years there has been a growing interest in plastic parts for applications such as spectrometers, microanalytical instrumentation, and medical applications. Also emerging is an interest in ceramic materials in LIGA fabricated structures. Ceramic materials allow improved magnetic properties, piezoelectric properties, and application at higher temperatures.

In order to produce metal, plastic, or ceramic LIGA parts, it is necessary to have the appropriate equipment, systems, and processes in order to conduct synchrotron exposures and subsequent development of the exposed PMMA to produce the required polymer mold. The present invention involves an apparatus for practicing the photoresist development step of the LIGA process. In particular, the present invention is drawn to a photoresist developer system comprising a group of developer tanks; appropriate developer solutions, high frequency solution agitation, continuous solution circulation and filtration, and close temperature control of the tank contents.

SUMMARY OF THE INVENTION

The present invention involves a developer station which enables a user to readily produce polymeric molds to be used in the production of precision micro-scale mechanical parts by the LIGA process.

It is, therefore, an object of the invention to provide an apparatus for preparing polymeric molds for subsequent production of micro-scale parts from engineering materials.

A further object of the invention is to provide a developer station to enable the preparation of polymeric molds to produce precise, high aspect ratio micro-scale parts from engineering materials and also molds having widely differing aspect ratios.

Still another object of the present invention is the production of molds exhibiting feature sizes which may be several orders of magnitude smaller than an overall mold dimension.

More specifically the present invention involves making a polymeric mold by carefully developing an exposed image in a photoresist substrate using the developer station described below.

Other objects and advantages of the present invention will become apparent from the following description and accompanying the drawings.

BRIEF DESCRIPTION OF THE DRAWINGS

The accompanying drawings, which are incorporated into and form a part of the disclosure, illustrate an embodiment of the invention and, together with the description, serve to explain the principles of the invention.

DETAILED DESCRIPTION OF THE INVENTION

The present invention is drawn to a photoresist developer station optimized to produce high aspect ratio polymeric parts or polymeric molds from which micro-scale parts from engineering materials can be produced. X-ray radiation from a synchrotron is passed through a specially designed mask to allow deep exposures in a x-ray resist, such as polymethylmethacrylate (PMMA) with precise lateral dimensions. The PMMA, after exposure to the synchrotron radiation, is placed in a chemical developer, and a polymeric mold is obtained by dissolution of the exposed portion of the PMMA resist layer. In this invention the chemical developer station includes the use of a series of developer tanks and solutions, including at least a chemical developer tank, an intermediate rinse tank, and a water rinse tank. Each tank can include a means to maintain temperature control in the tank solution. Each tank can also include a closed recirculation means and continuous filtration. Finally, a means to effectively agitate the solution with a source of high frequency, or "megasonic" vibration (as used hereinafter the term "megasonic" is intended to refer to sonic frequencies above about 500 kHz).

Figure 1:
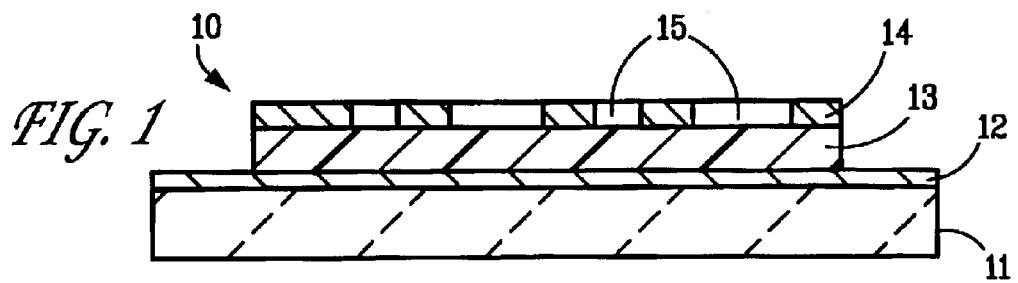
FIGS. 1–5 illustrate the processing operations of the prior art to produce micro-scale molds or parts, as shown in FIG. 5.

Referring now to the drawings, FIGS. 1–5 illustrate the prior art method of the LIGA process. FIG. 1 illustrates a LIGA wafer generally indicated at 10 and broadly composed of a substrate 11, a metal layer (electrode) 12, a layer 13 of x-ray photoresist such as polymethylmethacrylate (PMMA), and a mask 14 having patterned shapes 15 therein. By way of example, the substrate 11 is composed of silicon with a thickness of 600 μm and a diameter larger than the 3- or 4-inch diameter mask 14. The metal layer 12 may be composed of three layers, about a 700 Å titanium layer, a 4000 Å nickel or copper layer, and 700 Å layer of titanium. The PMMA layer 13 may vary in thickness of 100 μm to 3 mm, but is typically used with a thickness of about 50 μm greater than the final thickness of the microstructures being fabricated. Thus, the substrate 11, metal layer 12, and PMMA layer 13 may be obtained as an off-the-shelf component. The mask 14, for example, is formed from a 100 μm thick, 3 or 4-inch diameter metallized silicon substrate, and patterned using one or two layers of photoresist, as described above, and gold is electroplated in the photoresist pattern using a gold sulfide bath. The gold thickness ranges from about 8 μ to 30 μm depending on the desired lateral feature sizes and tolerance control. Thus, the mask 14 is generally described as a x-ray mask composed of a gold absorber patterned on a 100 μm metallized silicon substrate. Note, as shown as in FIG. 1, that the substrate 11 and metal layer 12, are larger than the PMMA layer 13 and the mask 14.

Figure 2:
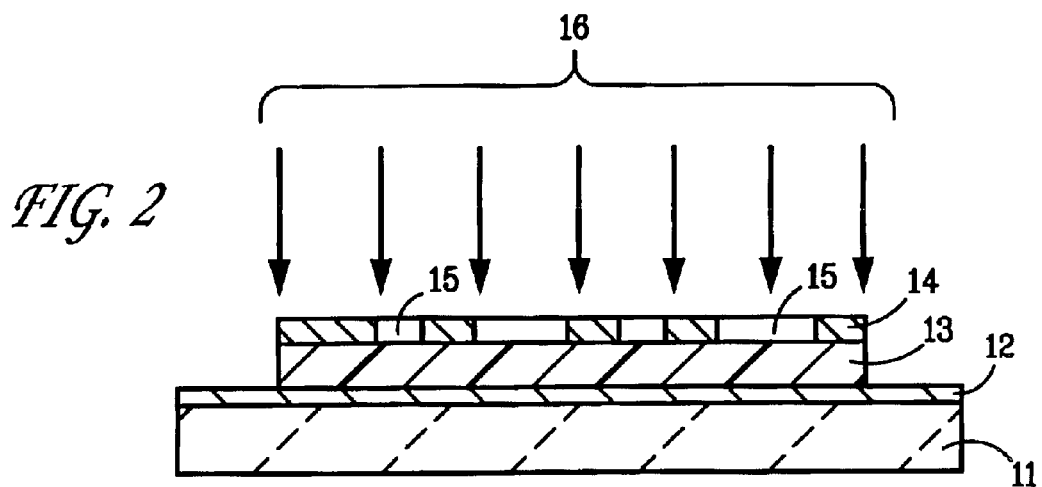

As shown schematically in FIG. 2, the LIGA wafer 10 is exposed to x-rays as indicated by arrow 16 from a synchrotron, such as by scanning of the mask 14 and PMMA resist layer 13 through a stationary x-ray beam to provide an evenly distributed exposure over the LIGA wafer 10.

Figure 3:
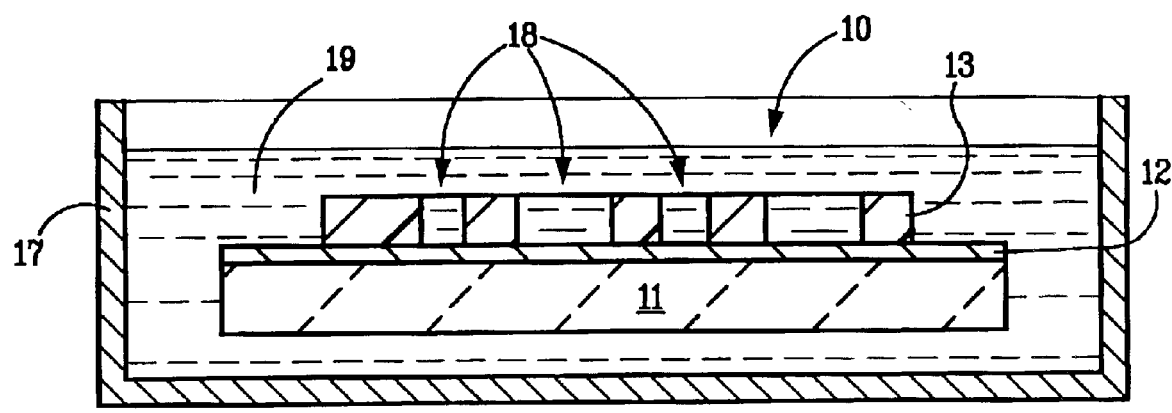

FIG. 3 schematically illustrates the prior art chemical development process. As shown in FIG. 3, the LIGA wafer 10 after x-ray exposure, as shown in FIG. 2, is placed in a chemical developer tank 17 for development of patterned openings as indicated at 18, in the PMMA layer 13 under the patterned areas 15 of the mask 14.

Figure 4:
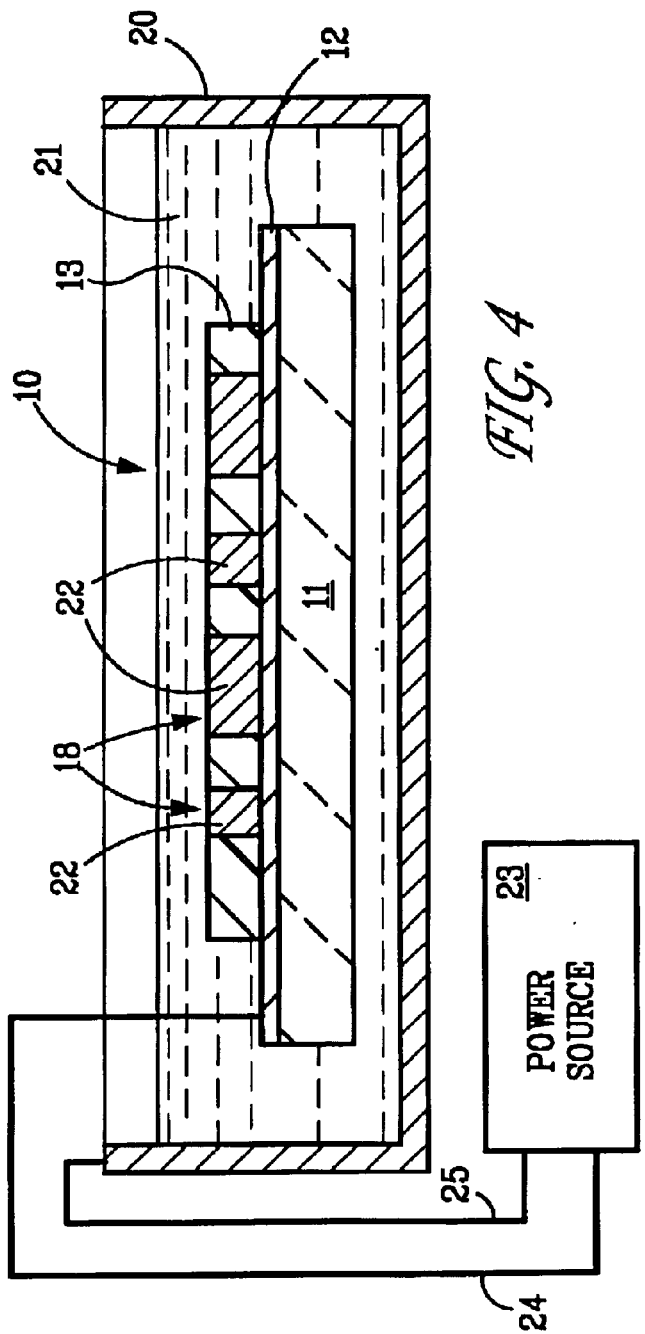
Figure 5:
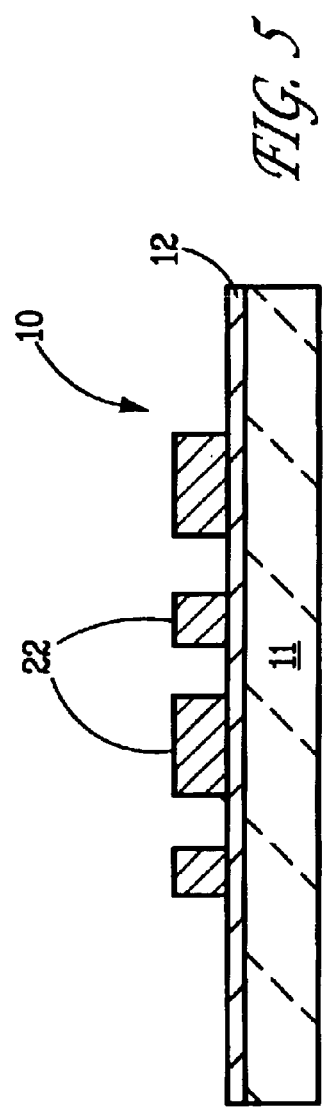

As shown in FIG. 4, the developed LIGA wafer 10 of FIG. 3, is placed in a plating tank 20 containing a plating solution 21 whereby the openings 18 in PMMA layer 13 are filled by an electroplating process to produce patterned microstructures 22. In the electroplating process, the metal layer 12 functions as an electrode and is connected to a power source 23 by a lead 24, with the tank 20 functioning as the electrode and connected to power source 23 by a lead 25. FIG. 5 illustrates the electroplated LIGA wafer 10 with patterned microstructures 22 formed on metal layer 12.

The final step in producing metal microparts is a lapping and polishing process used to bring the parts to their to the final thickness.

Following lapping and polishing, the microstructures 22 may be removed from the wafer 10 to produce microparts or, if microstructures 22 are to serve as molds, they are retained on the wafer.

THE PREFERRED EMBODIMENT OF THE PRESENT INVENTION

The invention is a development system for developing a PMMA photoresist having exposed patterns comprising both very small feature sizes, and very high aspect ratios between part minimum feature size and part overall extent. The development system of the present invention is described in greater detail hereinafter with respect to FIG. 6. The apparatus comprises a developer tank, an intermediate rinse tank and a final rinse tank, each tank having a source of high frequency sonic agitation, temperature control, and continuous filtration. The inventors have found that by moving the patterned, LIGA wafer 10, of FIG. 3, through a specific sequence of developer/rinse solutions, wherein the solutions are agitated with a source of high frequency sonic vibration, wherein the solution temperature of each tank is adjusted and closely controlled, and wherein the solutions are continuously recirculated and filtered, it is possible to maintain the kinetic dissolution of the exposed PMMA polymer as the rate limiting step. This condition is important because, when the kinetic dissolution is the rate limiting step instead of mass-transport of the developer solution, features of widely varying dimensions can be "developed," i.e., dissolved, at essentially the same rate. This means that development of small features do not dictate the conclusion of the development step.

Figure 6:
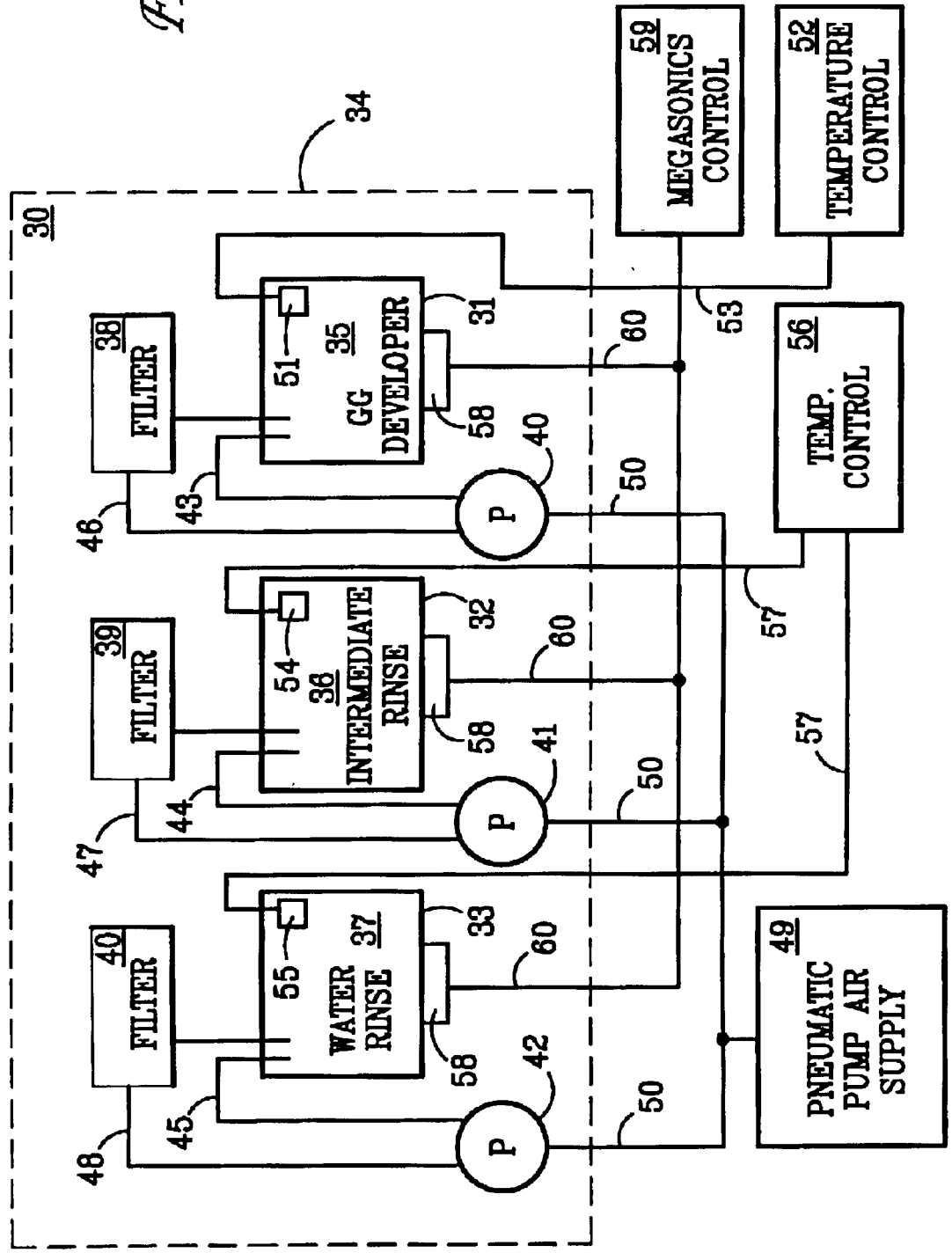
FIG. 6 schematically illustrates a three-tank system for development after exposure.

As shown schematically in FIG. 6, the development apparatus, generally indicated at 30, comprises three tanks 31, 32, and 33 located in an atmosphere controlled fume hood 34. The tanks comprise a developer tank 31, an intermediate rinse tank 32, and a water rinse tank 33, within each of which is contained a solution 35, 36, and 37, respectively, and the solutions are continuously filtered with filters 38, 39, and 40, which may be 0.2 micron polytetrafluoroethylene filters, with the solutions being drawn through the filters by peristaltic pumps 40, 41, and 42 via inlet lines 43, 44, and 45 and outlet lines 46, 47, and 48. Pumps 40, 41, and 42 are connected to a pneumatic pump air supply 49 via lines 50. Due to the corrosive nature of solution 36, tank 31 and all of the fluid inlet and outlet lines and fittings must be constructed of a chemically inert material, such as glass, ceramic, or polytetrafluoroethylene.

Tank 31 is provided with an immersion coil 51 connected to a temperature control 52 via line 53. Similarly, tanks 32 and 33 are provided with coils 54 and 55 connected to a temperature control 56 via lines 57. Coils 51, 54, and 55 are designed to operate by circulating warm water therein by temperature controls 52 and 56. The solution in each tank, therefore, is maintained, for example, at 25° C.±3° C. via the immersion coils 51, 54, and 55 which are constructed of gold plated copper tubing to minimize corrosion and tank solution contamination.

Each of tanks 31–33 is provided with a high frequency, sonic agitation unit indicated at 58 and hereinafter referred to as a megasonic unit. While the beneficial effect of this agitation is important in each of tanks 31–33, it is most important, and indeed essential, in the developer tank 31 where the agitation is used to loosen and remove the dissolving PMMA and to assist with the transport of fresh developer solution to the PMMA interface. Each of the megasonic units 58 is connected to a single megasonic control 59 or a separate control unit (not shown) via line 60. The megasonic transducer element is placed in the bottom of each tank but is not required to by fixed in any particular location.

By way of example, the developer solution 35 in developer tank 31 may comprise a solution of di-(ethylene glycol)

butyl ether, morpholine, ethanolamine; and water. The present invention utilizes a known solution composition consisting of 60$^w$/$_o$ di-(ethylene glycol) butyl ether, 20$^w$/$_o$ morpholine, 5$^w$/$_o$ ethanolamine, and 15$^w$/$_o$ water. Solution 36 in intermediate rinse tank 32 may, for example, comprise a solution of di-(ethylene glycol) butyl ether and water; and is in the present invention consists essentially of 80$^w$/$_o$ solution of di-(ethylene glycol) butyl ether in water. Solution 37 in rinse tank 33 is essentially pure water.

Tank solutions 35–37 may, for example, be circulated by pumps 40–42 through the filter 38–40. Circulation rates may be from nearly stagnant to several liter-per-minute in order to accommodate the wide range of development rates necessitated by the different designs and features used in LIGA. It is to be understood that the composition of solution in developer tank 31, will be dependent, particularly on the composition of the components of the wafer 10.

It is important to note that while the function of the developer solution is obvious, the development process is not. Rather, developing the PMMA is multi-step process which includes, among other steps, a gellation step which can, and often does, leave partially developed, or "gelled" PMMA on the surfaces of the microstructures 22 of FIG. 5 especially in regions of widely varying feature size. The inventors have found that a critical aspect of the instant invention is the use of the intermediate rinse solution 84. In particular, it was been found that by placing a wafers taken from the developer tank 31 directly into water rinse tank 33 without the intermediate rinse in tank 32, any partially developed PMMA photoresist immediately recrystallizes or "freezes" in place and ruins that mold. This step is crucial to the preparation of high quality microstructures 22 since any recrystallized PMMA cannot be further developed.

By using the intermediate rinse step in a solution containing di-(ethylene glycol) butyl ether and water after initial development, the tendency for recrystallization of gelled PMMA is virtually eliminated by continuing the development process. Together with the megasonic agitation the intermediate rinse removes any latent developed PMMA.

Similarly, the application of megasonic agitation to a photoresist development process is also not obvious. This equipment was originally designed to aid in cleaning flat silicon wafers prior to further microelectronics processing and while use of megasonic agitation has been suggested, in U.S. patent Ser. No. 4,213,807 (col. 3, line 19), to shorten a silicon oxide etching process step the teaching of this patent further associates megasonic agitation with a "cleaning" step (col. 3, line 28) to mechanically remove adhering particles. Application of megasonic agitation as a means for helping move product/reactants to and from a reacting (developing) photolithographic interface, therefore, is believed not to have been reported its application as an aid in improving the ability to prepare and produce micro-parts exhibiting a wide variance in dimension (high aspect ratio) is, therefore, believed to be unique.

A BEST MODE FOR PRACTICING THE PRESENT INVENTION

Figure 7:
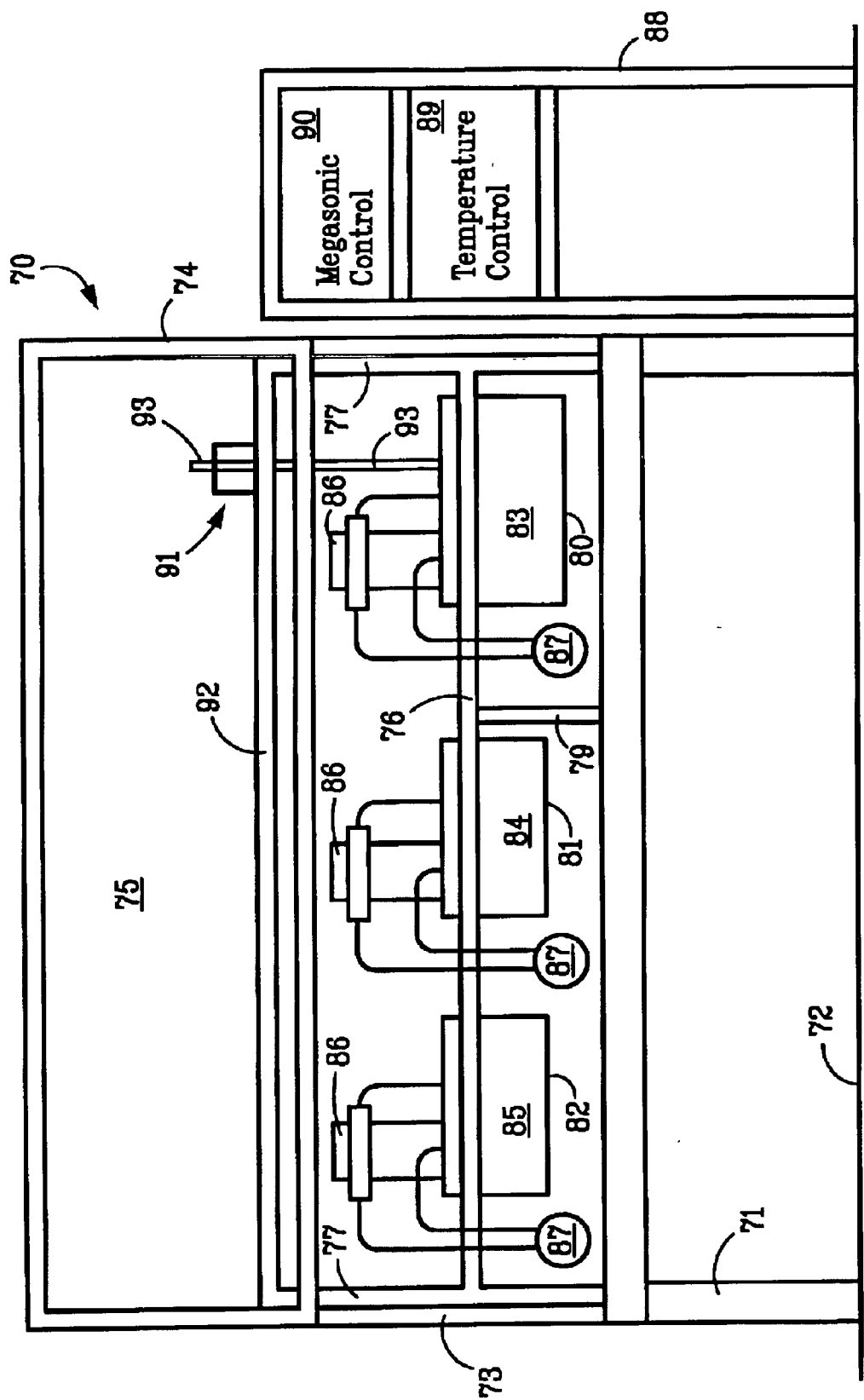
FIG. 7 schematically illustrates an assembly including the tank system of FIG. 6 and the controls therefor.

FIG. 7 illustrates a second embodiment of a three tank developer assembly, with each of the three tanks including filtration means, temperature control means, and megasonic agitation units. The developer assembly generally indicated at 70 is designed as a stand-alone developer work station and includes stand 71 mounted to floor 72. Positioned on stand 71 is a box 73 having a hood 74 which includes a window 75, the hood 74 being shown in raised position. Box 73 may be constructed of stainless steel, polytetrafluoroethylene, DELRIN™, polyethylene or any other corrosion resistant material. Window 75 is usually constructed with a high strength tempered glass or, if required, a blast-resistant transparent material such as a polycarbonate. The box 73 may be atmospherically controlled, and includes a horizontal support member 76 and two end vertical support members 77 to which support member 76 is connected at each end, and another vertical support member 79 for horizontal support member 76. Tanks 80, 81, and 82 are constructed of a corrosion resistant material such as glass, polytetrafluoroethylene, DELRIN™, or polyethylene and are retained in, or mounted to, horizontal support member 76, with tank 80 containing a developer solution 83, tank 81 containing an intermediate rinse solution 84, and tank 82, containing a rinse solution 85 of water. Each tank 80, 81, and 82 is provided with a filter 86 and a circulation pump 87, as described with respect to FIG. 6. Each tank is also provided with a temperature control coil and at least tanks 80 and 81 are provided with a megasonic agitation unit, again as described above with respect to FIG. 6.

Figure 8:
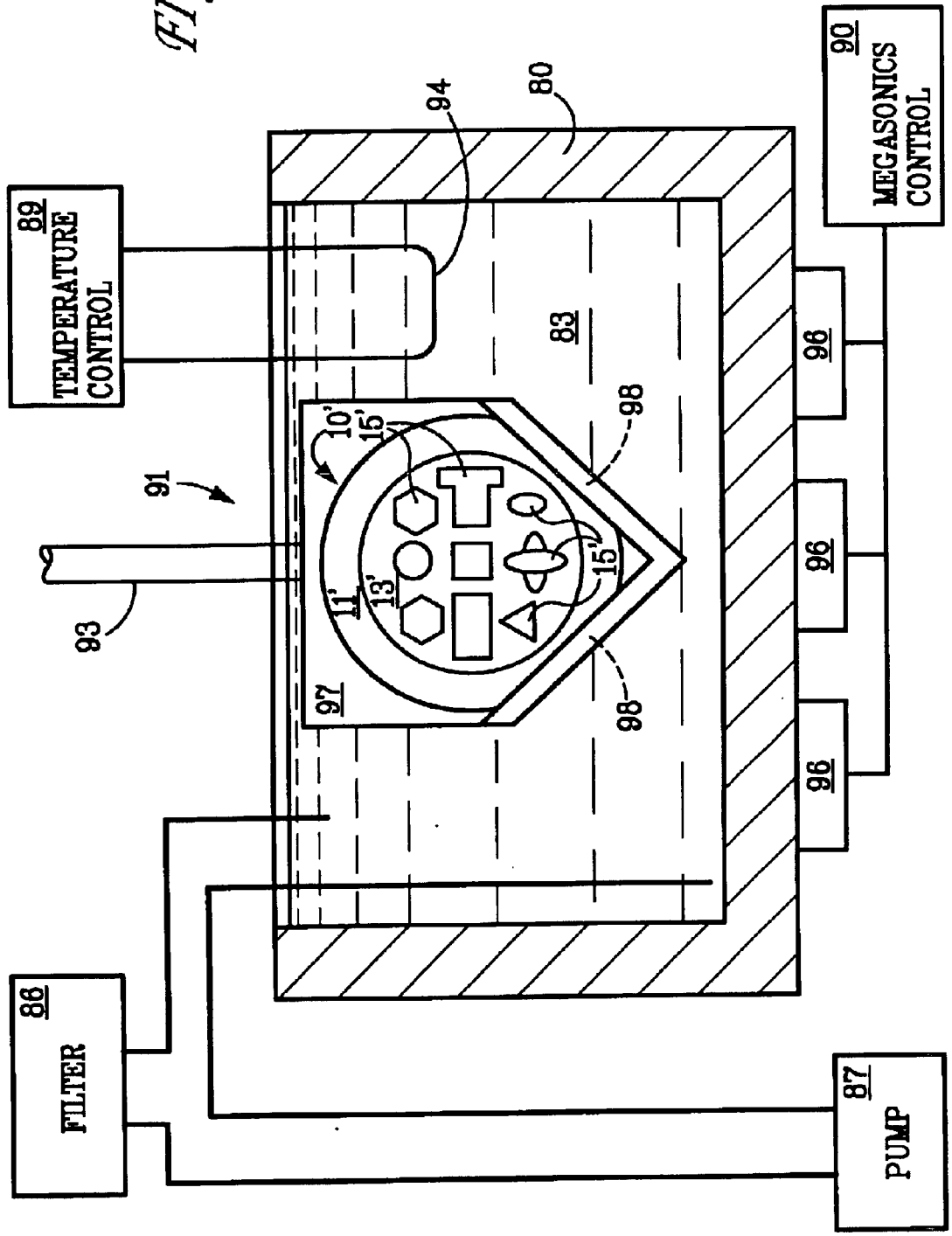
FIG. 8 schematically illustrates an enlarged view of one of the developer tanks having a filter and cooling coil with temperature control.

Positioned adjacent to stand 71 is a control rack 88 having mounted therein a temperature control 89 and a megasonic control 90. A LIGA wafer or substrate support assembly 91 is mounted in lid or top section 92 of box 73 and includes a handle or rod 93 which retains one or more LIGA wafers, as shown in FIG. 8. The wafer support assembly 91 is moved from tank 80 to tank 81 to tank 82 during the development process, thereby avoiding unwanted delays and maintaining control over the development process.

Figure 9:
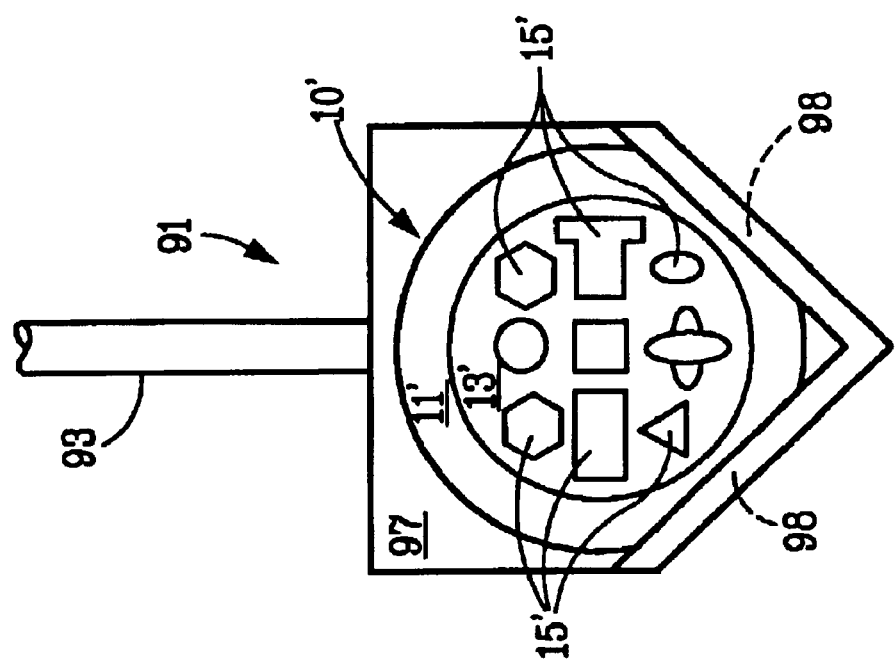
FIG. 9 illustrates an embodiment of a vertical wafer or substrate retaining assembly for use in the development tanks and subsequent plating.

The vertical wafer or substrate support assembly 91 is illustrated in detail in FIGS. 8 and 9. Illustrated components, and the developer tank 80 are similar to those of FIG. 7 and are given corresponding reference numerals. As shown in FIG. 8, the developer tank 80 is provided with a temperature control coil 94 and controller 89; and provided with megasonic agitation units 96 and controller 90. The vertical LIGA wafer or substrate support assembly, as shown in FIGS. 8 and 9, includes a holder 97 having lower side slits 98 into which is retained a LIGA wafer 10' having a metallized substrate 11' a layer of PMMA 13' with patterned shapes (parts) 15' formed in the PMMA layer 13 by x-ray exposure as described above. After a predetermined time, the wafer or substrate support assembly 91 is withdrawn from tank 80 and placed in tank 81, and then into tank 82 for completion of the chemical development process. The use of the support assembly allows quickly moving wafer 10' from tank to tank without allowing the surface and features of the patterned shapes (parts) 15' formed in the PMMA layer to dry.

Figure 10:
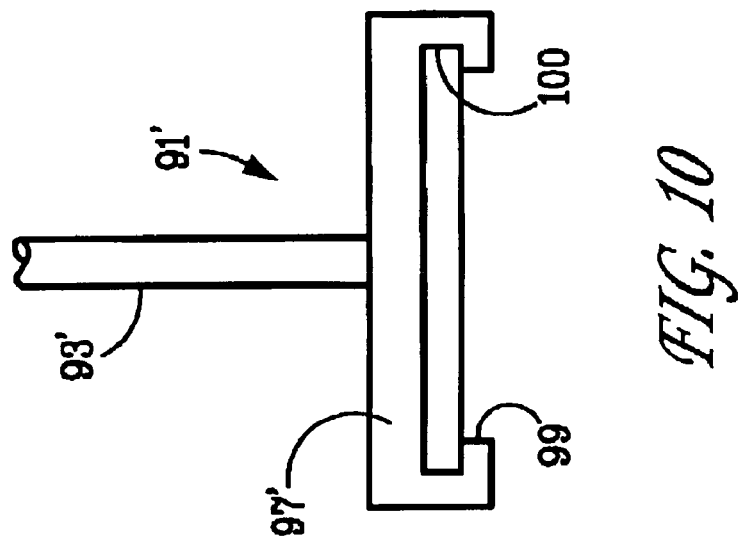
FIG. 10 illustrates an embodiment of a horizontal substrate or wafer retaining assembly for use in the development tanks and subsequent plating.

FIG. 10 illustrates a horizontal LIGA wafer support assembly 91' having a handle or rod 93' connected to a holder 97' which includes an opening 99 and groove 100 into which a LIGA wafer is slid and retained during the development process. Furthermore, wafer 10' is inserted into support assembly 91' such that the reacting surface of the PMMA is facing out into the tank solution and is oriented, therefore, in an inverted position. The inventors have discovered that the horizontal support assembly is required in many cases to maintain adequate mass transport at the reacting (developing) interface of the PMMA, for successful development of certain high aspect ratio microstructure devices. Presumably, this behavior is due to the intrinsic flow characteristics of the dissolving PMMA as it migrates out of the micro-channels created in the developing mold at sites of very small feature, such at the tips of gear teeth, and the like. It is therefore a critical aspect of this invention to orient the developing wafer 10' in the developer solution such that it is held in an inverted position.

It has thus been shown that the present invention provides the required system for producing microstructures and/or microparts utilizing the LIGA process. The method utilizes a multiple tank development process, whereby precise, high aspect ratio microstructures are produced in polymeric materials such as PMMA. The parts thus produced may be utilized as molds for polymeric and ceramic parts or may be finished as microparts for complex assemblies.

While a particular embodiment, process sequence, materials, development tank arrangement, and wafer holders have been described and or illustrated, such are not intended to be limiting. Modifications and changes may become apparent to those skilled in the art, and it is intended that the scope of the invention be limited only by scope of the appended claims.

What is claimed is:

1. A method for preparing a polymeric mold for producing a micro-scale part comprising the steps of:
   a) introducing a substrate having a photoresist layer into a developer solution, a portion of said layer having been exposed to a source of radiation, said developer solution for dissolving said exposed portion;
   b) applying a source of high frequency sonic agitation to said solution and to said layer for a period of minutes, said high frequency sonic agitation for assisting in removing said dissolving exposed portion;
   c) removing said substrate and said layer from said developer solution and immediately introducing said substrate and said layer into an intermediate rinse solution, consisting essentially of an aqueous solution of di(ethylene glycol) butyl either, said intermediate rinse solution for assisting in further removing and for preventing recrystallization of portions of said exposed photoresist left undissolved by said developer solution;
   d) applying a source of high frequency sonic agitation to said intermediate rinse solution and to said layer for a period of minutes; and
   e) removing said substrate and said layer from said intermediate solution and immediately introducing said substrate and said layer into a water rinse, said rinse for removing traces of said intermediate rinse solution.

2. The method of claim 1, wherein the steps of applying a source of high frequency sonic agitation include apply high frequency sonic vibration of about 750 kHz.

3. The method of claim 1, wherein the intermediate solution consists essentially of 80% di(ethylene glycol) butyl ether in water.

4. The method of claim 1, further including the step of controlling the temperature of each of said solutions.

5. The method of claim 4, wherein said step of controlling said temperature between about 20° C. to 35° C. to within a range of 3° C.

* * * * *